United States Patent [19]

Loberg

[11] 4,052,623
[45] Oct. 4, 1977

[54] ISOLATED SEMICONDUCTOR GATE CONTROL CIRCUIT

[75] Inventor: Hans O. Loberg, Northeast, Pa.

[73] Assignee: General Electric Company, Erie, Pa.

[21] Appl. No.: 713,139

[22] Filed: Aug. 10, 1976

[51] Int. Cl.² .............................................. H03K 17/60
[52] U.S. Cl. ...................................... 307/251; 307/246; 307/282
[58] Field of Search ............... 307/300, 304, 314, 282, 307/251, 268

[56] References Cited

U.S. PATENT DOCUMENTS

| 3,322,966 | 5/1967 | Allmark | 307/282 X |
| 3,571,624 | 3/1971 | Leung | 307/300 X |
| 3,757,144 | 9/1973 | Hetterscheid et al. | 307/300 |
| 3,764,921 | 10/1973 | Huard | 307/251 X |
| 3,872,327 | 3/1975 | Rudert et al. | 307/300 |
| 3,930,170 | 12/1975 | Burens et al. | 307/282 X |

Primary Examiner—John S. Heyman
Attorney, Agent, or Firm—Arnold E. Renner; Philip L. Schlamp

[57] ABSTRACT

A circuit for the generation or development of a gating signal for a semiconductor device which is isolated from the circuit of the device itself is comprised of a pulse generating section which feeds pulses to the primary winding of a transformer to thereby induce pulses into the transformer secondary winding. An output section is connected to the secondary winding of the transformer which provides alternately, relatively positive and negative going output signals which serve as the gating signals for the semiconductor device. As provided in the preferred embodiment, the semiconductor device is a field effect transistor and the output section insures that during times in which it is desired to have the transistor conducting, a relatively positive pulse is applied to the gate electrode of the field effect transistor while during periods between pulses, when it is desired to have the transistor non-conducting, there is a sufficiently negative signal applied to the gate electrode so as to maintain the field effect transistor in its nonconducting state.

5 Claims, 5 Drawing Figures

ISOLATED SEMICONDUCTOR GATE CONTROL CIRCUIT

BACKGROUND OF THE INVENTION

The present invention relates generally to gating circuits for semiconductor devices and more particularly to gating circuits of the isolated type.

In many instances in the electrical disciplines it is desired to gate a semiconductor device by means of a simple circuit which provides isolation between the device itself and its associated circuitry and the circuitry which is providing the gating signal. It is generally known that isolation can be provided by various means such as optical means or transformers to maintain the actual device circuitry electrically apart from that which generates the gating signal.

One known type of semiconductor device is the field effect transistor (FET) which, when operating in a switching mode, requires a signal of a first polarity (e.g., positive) at its gate electrode to maintain the FET in a conductive state while requiring a signal to the opposite polarity at the gate electrode to insure its nonconducting state.

The customary method of operating a FET is to apply a d.c. bias to the gate electrode and to then apply an over-riding control signal to that electrode to change the FET's conductive state. This type of control becomes difficult when isolation is desired and prior attempts to achieve isolated control have resulted in circuits which are either relatively expensive or which do not provide the requisite stability and operability to function properly over a wide range of operating conditions and component values.

SUMMARY OF THE INVENTION

It is, therefore, an object of the present invention to provide an improved isolated gate circuit for a semiconductor device.

It is a further object to provide an isolated gate circuit for a semiconductor device which is both inexpensive and stable throughout its operating range.

It is a still further object to provide an isolated gate control circuit for use with a field effect transistor which serves to provide both relatively positive and negative signals to selectively maintain the transistor in its conductive and nonconductive state as desired.

The foregoing and other objects are satisfied in accordance with the present invention through the provision of the circuit which is comprised basically of three main sections; a pulse generating section, a transformer section and an output section. The pulse generating section provides a series of pulses to the primary winding of a transformer in the transformer section which pulses are at a frequency corresponding to the desired operating frequency of the circuit. Each pulse thus applied to the primary winding induces a signal in the transformer secondary winding which, through the operation of the output section, serves to maintain the appropriate positive or negative signal at the gating electrode of the semiconductor device, in the peferred embodiment a FET, so as to control the operation of that device while yet retaining isolation between the device itself and the circuit originating the gating signal.

BRIEF DESCRIPTION OF THE DRAWING

While the present invention is particularly defined in the claims annexed to and forming a part of this specification, a better understanding can be had from the following description taken in conjunction with the accompanying drawing in which:

DETAILED DESCRIPTION

Figure 1:
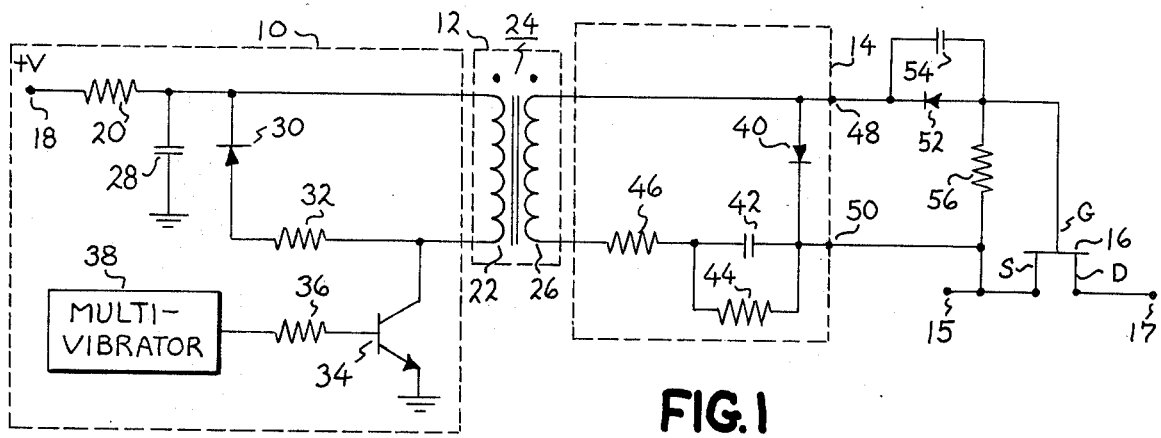
FIG. 1 is a schematic drawing showing the present invention in its peferred embodiment as providing gate signals to a field effect transistor.

Referencing now FIG. 1, there is shown the present invention in its preferred emobodiment as it is applied to provide the gating pulses to a field effect transistor (FET). The ciruclt may be considered as being divided into three main parts as illustrated by the dashed lined boxes 10, 12 and 14. Box 10 is defined as a pulse generating section while block 12 shows what is referred to as the transformer section. Within block 14 is the output section of the circuit of the present invention which serves to output a control signal. As shown in FIG. 1, the control signal from section 14 is applied to a semiconductor device 16 illustrated as a FET having a gate electrode (G), a source electrode (S) and a drain electrode (D). The FET 16 would be connected in an operating circuit (not shown) by way of terminals 15 and 17.

The exact nature of the pulse generating section is not critical to the present invention, it being necessary only that this section provide, to the transformer section 12, a series of well-defined pulses occurring at a frequency corresponding to the frequency at which it is desired to operate the device 16 and that the on and off times of the pulses be consistent with the overall operation of the circuit to which the device 16 is applicable. One means of achieving this desired result is the circuit illustrated in FIG. 1. As shown in block 10, a terminal 18 has applied thereto a positive voltage indicated as +V. A resitor 20 is connected to the terminal 18 and serves to apply the voltage +V to one end of a primary winding 22 of a transformer 24 within the transformer section 12. A capacitor 28 is connected between the junction of the resistor 20 and the primary winding 22 and ground. Resistor 20 and the capacitor 28 form a filter circuit of the type well known in the art. A series circuit including a diode 30 and a resistor 32 is connected in parallel with the transformer primary winding 22 and forms a reset circuit for the transformer.

Figure 2A:
FIGS. 2a, 2b and 2c illustrate waveforms helpful in understanding the operation of the circuit of FIG. 1; and, FIG. 3 is a schematic drawing, partially in block form, illustrating the application of the present invention to the control of a circuit of a copending U.S. Patent application as hereinafter indentified.

The collector of a transistor 34 is connected to the free end of the primary winding 22 and the emitter of the transistor is connected to ground. The base of the transistor 34 is connected by way of an input resistor 36 to a suitable oscillator or multivibrator 38 which serves to supply a series of pulses by way of resistor 36 to the base of transistor 34. These pulses, in the embodiment shown, are positive going pulses and are of sufficient magnitude to place the transistor 34 into the conducting state. The duration of the pulses and the amount of time between adjacent pulses will, of course, depend upon the requirements of the overall system subject to the fundamental criteria that the individual pulses be of sufficient duration as to permit a well defined current to flow through the transformer primary and further that there be sufficient spacing between the pulses to permit the transformer to reset. In one particular application of the present invention, pulse duration was approximately 15 microseconds while the period between pulses was approximately 150 microseconds. When a pulse is emitted from the multivibrator 38, transistor 34 is rendered conductive and a current flows from the terminal 18, through resistor 20 and the primary winding 22 and by way of the collector to emitter circuit to the transistor 34 to ground. This current will flow so long as transistor 34 is conductive; i.e., the length of the time of the pulse. These pulses are illustrated in FIG. 2a.

Figure 2B:
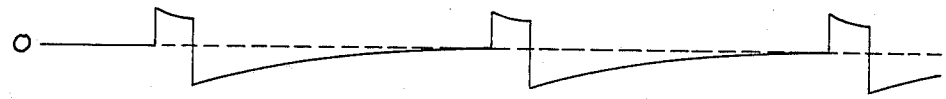

With a current in the primary winding 22, a signal will be included into the transformer secondary winding 26. The output of the secondary winding is illustrated in FIG. 2b and it is seen that with the leading edge of the primary current (FIG. 2a) there is induced a positive going signal which slowly diminishes until the disappearance of the primary current at which time the transformer will reset to an approximately equal negative value. From this negative value the signal will slowly decay toward zero until the occurrence of the next primary current pulse.

With the induction of the voltage signal into the secondary winding 26, a current will be established in the path including a resistor 46, the winding 26, a diode 40, and the parallel combination of a capacitor 42 and a resistor 44. With the flow of this secondary current, there will appear at output terminals 48 and 50 of the output section 14 a voltage which is equal to the forward voltage drop of the diode 40 which, typically, is approximately +0.6 volts. This voltage is applied, by way of an input circuit between the gate and source electrodes of the FET 16 thus placing the FET 16 into the conductive state. It should be noted that the illustrated input circuit to the FET 16 is merely one of many standard types and does not constitute a part of the present invention. As depicted, the input circuit includes the parallel combination of a diode 52 and a capacitor 54 connected in series between the terminal 48 and the gate electrode of the FET 16. A further resistor 56 is connected between the gate and the source electrodes. This particular circuit was utilized in acordance with generally accepted design practices and is well known in the art. Other input circuits such as a simple input resistor or a resistor input with a resistor between the gate and source electrodes could also be used in appropriate instances.

Figure 2C:
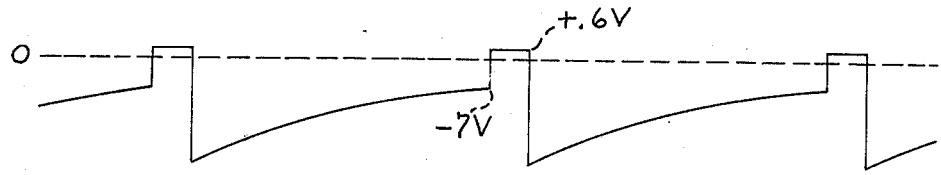

The secondary current through diode 40 serves not only to bias the FET 16 into the conductive state but also to charge capacitor 42 in a direction such that its right hand plate is positive. When the output of multivibrator 38 goes to zero, transistor 34 will turn off and the output current pulse from the secondary of the transformer 24 goes to zero. At this time, the capacitor voltage is such so as to negatively bias diode 40 and places across that diode a negative voltage which, with the selection of proper components, is sufficient to keep the FET in its nonconductive state. This value may be, for example, −7 volts. The voltage across diode 40 which serves as the gate voltage to the FET 16 is illustrated in FIG. 2c. It should be noted that FIGS. 2a, b and c are not to scale but have been emphasized for purposes of clarity. From these figures it can be seen that with the occurrence of a transformer pulse (FIG. 2a) the voltage across the diode 40 (FIG. 2c) will rise to the forward drop voltage of the diode 40 or approximately +0.6 volts as previously stated. With the disappearance of the pulse of the multivibrator 38 and the reversal of the transformer output as illustrated in FIG. 2b, the voltage across the diode will immediately reverse and go to a negative value. With the resetting of the transformer as shown in FIG. 2c, the voltage across the diode 40 is negative and hence the FET 16 is rendered nonconductive.

In the circuit just described, resistors 44 and 46 are selected in accordance with the value of the capacitor 42 such that the resistor-capacitor network has a sufficient time constant to permit the capacitor 42 to charge to a value sufficient such that with the disappearance of the transformer signal, the negative voltage maintained across the diode 40 will remain at a sufficiently negative value to maintain the FET in the nonconducting state.

Figure 3:
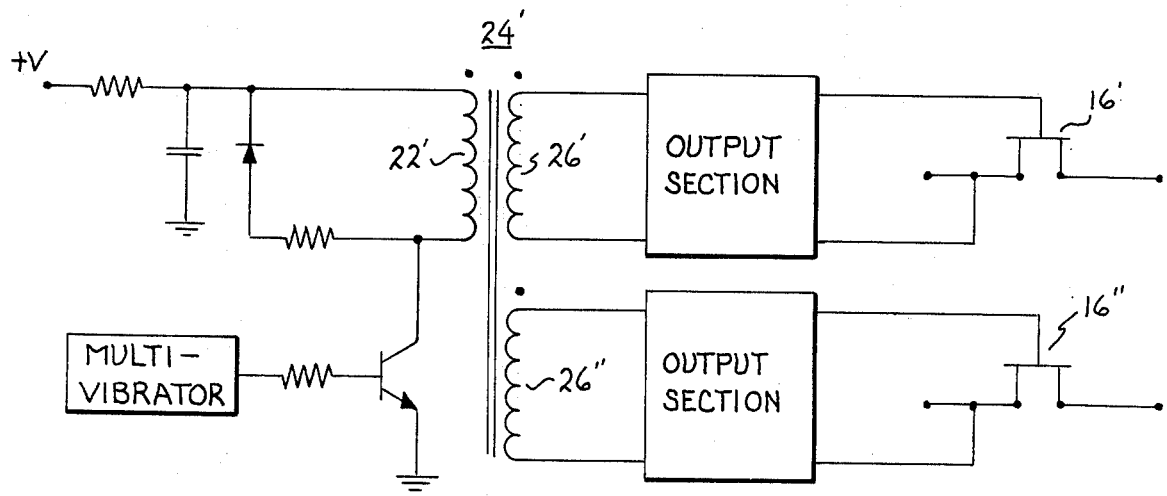

It was previously mentioned that the present invention has found particular application in a circuit which forms the basis of a copending application. This application "Load Circuit Representation Circuit" by N. E. Born et al, was filed on even date herewith and is further indentified by Ser. No. 713,104. In the circuit of that patent application it was desired to oerate two FET swtiches simultaneously. FIG. 3 illustrates, in simplified form, how this may be achieved employing the present invention. As may be seen, FIG. 3 is substantially identical to the depiction of FIG. 1 with the exception that the transformer here shown has a single primary winding 22′ and two secondary windings 26′ and 26″. An output section which may be identical to that shown within the dashed lined block 14 of FIG. 1 is connected to each of the secondary windings and serves to supply, respectively, gating signals to each of two FETs, respectively, 16′ and 16″. In view of the description of FIG. 1, it is not believed necessary to describe in detail the operation of FIG. 3. Suffice it to say that, with the occurrence of a current in the primary winding, voltages will be simultaneously induced into the two secondary windings 26′ and 26″ such that through the action of a respective output section connected to each of these secondary windings the FETs 16′ and 16″ are simultaneously fired.

Thus, it is seen that there has been provided an economical and dependable gating ciruit for a semiconductor device which serves to accurately maintain both positive and negative gating signals to that device without the aid of a d.c. bias which is common in the art.

While there has been shown and described what is at present considered to be the preferred embodiment of the present invention, modifications thereto will readily occur to those skilled in the art. It is not desired, therefore, that the invention be limited to the specific arrangements shown and described and it is intended to cover in the appended claims all such modifications as fall within the true spirit and scope of the invention.

What is claimed is:

1. An isolated gate control for a voltage controlled semiconductor device responsive to gate signals to be thereby alternately rendered conductive and nonconductive comprising:
   a. pulse generating means to provide a train of pulses at a frequency corresponding to the desired operational rate of the semiconductor device;
   b. a transformer having primary and secondary windings;
   c. means for connecting said pulse generating means to said primary winding whereby a pulse is induced into said secondary winding; and,
   d. an output circuit connected to said secondary winding, said circuit including means for alternately providing relatively positive and negative going output voltage signals serving as gate signals to the semiconductor device, each of said output signals having minimum prescribed absolute voltage values during periods corresponding to, respectively, the period of the pulses of said train and the period of time between adjacent pulses.

2. The invention in accordance with claim 1 in which the semiconductor device is a field effect transistor and wherein said relatively positive going output signals serve to render said transistor conductive and said relatively negative going pulses render said transistor nonconductive.

3. A circuit for generating isolated gate signals for controlling the conductive state of a field effect transistor comprising:
   a. a pulse generating means for providing a train of pulses at a frequency corresponding to the desired operational rate of said tansistor;
   b. a transformer having primary and secondary windings;
   c. means for connecting said pulse generating means to said primary winding whereby a pulse is induced into said secondary winding; and,
   d. an output circuit connected to said secondary winding for providing relatively positive and negative signals serving as said gate signals, said output circuit including a diode and a resistor-capacitor network, said resistor-capacitor network having a time constant of adequate duration to maintain the gate signal at a level sufficient in magnitude to maintain the transistor in the nonconducting state during the time between pulses from said generator.

4. The invention in accordance with claim 3 wherein said pulse generating means develops positive going pulses in said secondary winding and said diode serves to conduct positive going pulses to thereby gate said field effect transistor into the conducting state.

5. The invention in accordance with claim 4 wherein the gate signals are derived from the voltage across said diode.

* * * * *